(12) United States Patent
Han

(10) Patent No.: US 12,476,130 B2
(45) Date of Patent: *Nov. 18, 2025

(54) COMPONENT HANDLER

(71) Applicant: Semiconductor Technologies & Instruments Pte Ltd, Singapore (SG)

(72) Inventor: Chin Fong Han, Singapore (SG)

(73) Assignee: Semiconductor Technologies and Instruments Pte Ltd, Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 18/424,906

(22) Filed: Jan. 29, 2024

(65) Prior Publication Data

US 2025/0079222 A1 Mar. 6, 2025

Related U.S. Application Data

(63) Continuation of application No. 17/632,793, filed on Feb. 4, 2022, now Pat. No. 11,887,876.

(51) Int. Cl.
*H01L 21/68* (2006.01)
*B65G 47/84* (2006.01)
(Continued)

(52) U.S. Cl.
CPC .......... *H01L 21/681* (2013.01); *B65G 47/848* (2013.01); *H01L 21/677* (2013.01);
(Continued)

(58) Field of Classification Search
CPC ... H01L 21/677; H01L 21/68; H01L 21/6838; H01L 21/681; B65G 49/05; B65G 47/74; B65G 47/846; B65G 47/848; B65G 29/02
(Continued)

(56) References Cited

U.S. PATENT DOCUMENTS

| | | | |
|---|---|---|---|
| 11,887,876 B2 * | 1/2024 | Han | H01L 21/6838 |
| 2014/0102850 A1 | 4/2014 | Cheng et al. | |
| 2018/0053671 A1 | 2/2018 | Cheng et al. | |

FOREIGN PATENT DOCUMENTS

| | | |
|---|---|---|
| CN | 107863314 A | 3/2018 |
| CN | 107887295 A | 4/2018 |

(Continued)

*Primary Examiner* — James R Bidwell
(74) *Attorney, Agent, or Firm* — The Webb Law Firm

(57) ABSTRACT

The present disclosure relates to a system (100) for handling components (102). The system (100) comprises a turret assembly (200) comprising a turret (202) rotatable about a horizontal axis (204); and a plurality of end effectors (206) around the turret (202) and aligned radially from the horizontal axis (204). The system (100) further comprises a support assembly (300) arranged to support a source substrate (302) comprising singulated components (102); and a component transfer assembly (400) arranged to support a component transfer medium (402) for receiving the singulated components (102) from the end effectors (206). The turret assembly (200), support assembly (300), and component transfer assembly (400) are arranged vertically to each other. During rotation of the turret (202), the end effectors (206) continually pick the singulated components (102) from the source substrate (302) and place the picked singulated components (102) on the component transfer medium (402).

20 Claims, 10 Drawing Sheets

(51) Int. Cl.
  *H01L 21/677* (2006.01)
  *H01L 21/683* (2006.01)
(52) U.S. Cl.
  CPC ........ *H01L 21/6838* (2013.01); *B65G 47/846* (2013.01); *B65G 2203/0233* (2013.01); *B65G 2203/041* (2013.01)
(58) Field of Classification Search
  USPC ...................................................... 198/478.1
  See application file for complete search history.

(56) References Cited

FOREIGN PATENT DOCUMENTS

| | | |
|---|---|---|
| DE | 102017008869 B3 | 10/2018 |
| EP | 2339611 A1 | 6/2011 |
| JP | 01250845 A | 10/1989 |
| JP | 2013004811 A | 1/2013 |
| JP | 5892669 B1 | 3/2016 |
| KR | 20070059654 A | 6/2007 |
| KR | 20170006343 A | 1/2017 |
| WO | 03058708 A1 | 7/2003 |
| WO | 2014112041 A1 | 7/2014 |
| WO | 2015079843 A1 | 6/2015 |
| WO | 2017119786 A1 | 7/2017 |
| WO | 2019057469 A1 | 3/2019 |

\* cited by examiner

COMPONENT HANDLER

CROSS-REFERENCE

This application is a continuation of U.S. patent application Ser. No. 17/632,793 filed Feb. 4, 2022, now U.S. Pat. No. 11,887,876, issued Jan. 30, 2024, which is the U.S. national phase of International Patent Application No. PCT/SG2019/050547, filed Nov. 8, 2019, the disclosures of which are hereby incorporated by reference in their entireties.

TECHNICAL FIELD

The present disclosure generally relates to a component handler. More particularly, the present disclosure describes various embodiments of a system and method for handling components, e.g. semiconductor dies, using a rotatable turret.

BACKGROUND

Semiconductor products such as semiconductor integrated circuits are generally fabricated in wafer form or in package form, and then singulated into multiple components such as semiconductor dies. The singulated components typically undergo further processing steps until they are packaged and distributed. Each processing step may occur at a different and distinct processing station and/or by a different processing module. Conventionally, each component is first picked up at a first position and transferred between different processing stations before being offloaded at a second position on a transfer medium. The components are processed at the processing stations either while in motion or when temporarily stationary at the processing stations depending on the processing requirements. During the various processes, the singulated components are typically transported from one station to another in batches. The components are typically transferred in an automated, compact, and high-speed environment, so it is important to minimize risk of damage to the components, as well as to achieve high throughput and accuracy, while transferring the components.

Some existing devices known in the semiconductor industry for handling and transferring components include a tape and reel assembly as well as a component handler described in WO 2009/128790. The latter is a rotating component handler having a flipper mechanism that is driven by a motor. The flipper rotatably flips the flipper head from a retrieval position to an offloading position using a cam and follower mechanism. One problem with this component handler is that the high rotational speeds of the flipper mechanism exerts high frictional forces on the cam and follower mechanism, thereby prematurely shortening the life span of the cam and follower mechanism.

Therefore, in order to address or alleviate at least one of the aforementioned problems and/or disadvantages, there is a need to provide an improved component handler.

SUMMARY

According to a first aspect of the present disclosure, there is a system for handling components. The system comprises a turret assembly comprising: a turret rotatable about a horizontal axis; and a plurality of end effectors attached to and arranged peripherally around the turret, the end effectors aligned radially from the horizontal axis. The system further comprises: a support assembly arranged to support a source substrate comprising singulated components, the support assembly arranged vertically to the turret assembly; and a component transfer assembly arranged to support a component transfer medium for receiving the singulated components from the end effectors, the component transfer assembly arranged vertically to the turret assembly. Wherein the turret assembly is disposed between the support assembly and component transfer assembly, and during rotation of the turret, the end effectors continually pick the singulated components from the source substrate and place the picked singulated components on the component transfer medium.

According to a second aspect of the present disclosure, there is a method for handling components. The method comprises: supporting a source substrate on a support assembly arranged vertically to a turret assembly, the source substrate comprising singulated components; supporting a component transfer medium on a component transfer assembly arranged vertically to the turret assembly, the component transfer medium for receiving the singulated components from a plurality of end effectors of the turret assembly; rotating a turret of the turret assembly about a horizontal axis, the end effectors attached to and arranged peripherally around the turret and aligned radially from the horizontal axis; during rotation of the turret, actuating the end effectors to continually pick the singulated components from the source substrate and place the picked singulated components on the component transfer medium, wherein the turret assembly is disposed between the support assembly and component transfer assembly.

According to a third aspect of the present disclosure, there is a turret assembly for handling components. The turret assembly comprises: a turret rotatable about a horizontal axis; and a plurality of end effectors attached to and arranged peripherally around the turret, the end effectors aligned radially from the horizontal axis, wherein during rotation of the turret, the end effectors continually pick singulated components from a source substrate and place the picked singulated components on a component transfer medium; and wherein the source substrate, turret assembly, and component transfer medium are arranged vertically to each other, the turret assembly being disposed between the source substrate and component transfer medium.

A component handler according to the present disclosure are thus disclosed herein. Various features, aspects, and advantages of the present disclosure will become more apparent from the following detailed description of the embodiments of the present disclosure, by way of non-limiting examples only, along with the accompanying drawings.

DETAILED DESCRIPTION

Figure 1:
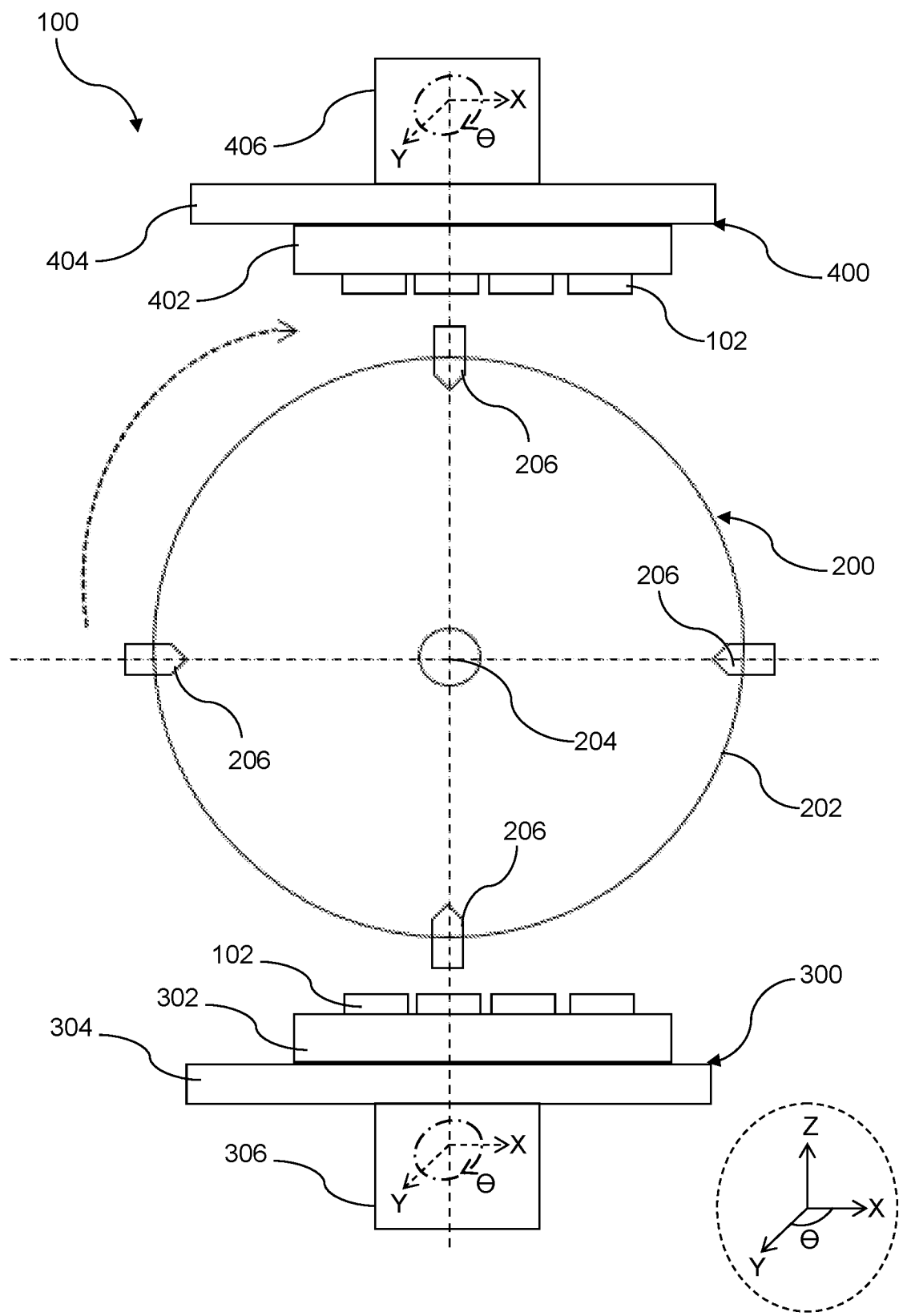
FIG. 1 is a schematic illustration of a system for handling components, in accordance with some embodiments of the present disclosure.

For purposes of brevity and clarity, descriptions of embodiments of the present disclosure are directed to a component handler in accordance with the drawings. While aspects of the present disclosure will be described in conjunction with the embodiments provided herein, it will be understood that they are not intended to limit the present disclosure to these embodiments. On the contrary, the present disclosure is intended to cover alternatives, modifications and equivalents to the embodiments described herein, which are included within the scope of the present disclosure as defined by the appended claims. Furthermore, in the following detailed description, specific details are set forth in order to provide a thorough understanding of the present disclosure. However, it will be recognized by an individual having ordinary skill in the art, i.e. a skilled person, that the present disclosure may be practiced without specific details, and/or with multiple details arising from combinations of aspects of particular embodiments. In a number of instances, well-known systems, methods, procedures, and components have not been described in detail so as to not unnecessarily obscure aspects of the embodiments of the present disclosure.

In embodiments of the present disclosure, depiction of a given element or consideration or use of a particular element number in a particular figure or a reference thereto in corresponding descriptive material can encompass the same, an equivalent, or an analogous element or element number identified in another figure or descriptive material associated therewith.

References to "an embodiment/example", "another embodiment/example", "some embodiments/examples", "some other embodiments/examples", and so on, indicate that the embodiment(s)/example(s) so described may include a particular feature, structure, characteristic, property, element, or limitation, but that not every embodiment/example necessarily includes that particular feature, structure, characteristic, property, element or limitation. Furthermore, repeated use of the phrase "in an embodiment/example" or "in another embodiment/example" does not necessarily refer to the same embodiment/example.

The terms "comprising", "including", "having", and the like do not exclude the presence of other features/elements/steps than those listed in an embodiment. Recitation of certain features/elements/steps in mutually different embodiments does not indicate that a combination of these features/elements/steps cannot be used in an embodiment.

As used herein, the terms "a" and "an" are defined as one or more than one. The use of "/" in a figure or associated text is understood to mean "and/or" unless otherwise indicated. The term "set" is defined as a non-empty finite organization of elements that mathematically exhibits a cardinality of at least one (e.g. a set as defined herein can correspond to a unit, singlet, or single-element set, or a multiple-element set), in accordance with known mathematical definitions. The recitation of a particular numerical value or value range herein is understood to include or be a recitation of an approximate numerical value or value range. As used herein, the terms "first", "second", "third", "fourth", etc. are used merely as labels or identifiers and are not intended to impose numerical requirements on their associated terms. As used herein, the term "each other" represents a reciprocal relation between two or more elements.

In representative or exemplary embodiments of the present disclosure, there is a system 100 for handling components 102 as shown in FIG. 1. The system 100 includes a turret assembly 200, a support assembly 300 arranged vertically to the turret assembly 200, and a component transfer assembly 400 arranged vertically to the turret assembly 200. Specifically, the turret assembly 200 is disposed between the support assembly 300 and component transfer assembly 400. In many embodiments, the support assembly 300 is disposed below the turret assembly 200 and the component transfer assembly 400 is disposed above the turret assembly 200.

The turret assembly 200 is configured for picking or retrieving singulated or individual components 102 from the support assembly 300, transferring the picked singulated components 102 towards the component transfer assembly 400, and placing or releasing the picked singulated components 102 at the component transfer assembly 400. The singulated components 102 may be semiconductor or integrated circuit dies, chips, or packages.

The turret assembly 200 includes a turret 202 rotatable about a horizontal axis 204. As shown in FIG. 1, the horizontal axis 204 refers to the Y-axis and the turret 202 is rotatable about the XZ-plane. The turret assembly 200 further includes a plurality of end effectors 206 attached to and arranged peripherally around the turret 202. The end effectors 206 are configured for picking and placing the singulated components 102. Further, the end effectors 206 are aligned radially from the horizontal axis 204, such that the picking and placing of the singulated components 102 are along a radial direction of the turret 202. The end effectors 206 may also be referred to as pick-and-place devices having pickup heads for retrieving and releasing the singulated components 102.

The support assembly 300 is arranged to support a source substrate 302 including the singulated components 102. In many embodiments, the source substrate 302 is a semiconductor wafer having singulated semiconductor dies as the components 102. The support assembly 300 includes a support portion 304 for supporting the source substrate 302, such as a wafer supporting or retaining structure for supporting the singulated wafer. The wafer supporting structure may be a wafer table, such as one with a highly planar or ultra-planar support surface. The wafer and/or components 102 may be supported on the wafer table by a wafer support medium, such as a film frame, sticky membrane, sticky tape, or base plate, as will be readily understood by the skilled person.

In some embodiments, the support portion 304 includes a plurality of suction ports for facilitating the mating of the source substrate 302 onto the surface of the support portion 304. The suction ports can be activated to hold the support portion 304 for retrieval of the components 102, and deactivated to release the source substrate 302 for discarding or disposal. It will be appreciated that there may be other means for engaging or holding the source substrate 302 onto the support portion 304. For example, there may be a porous portion formed in the interior of the support portion 304 in place of the suction ports. The porous portion is exposable to negative pressures or positive pressures to accomplish the same function as the suction ports as will be readily understood by the skilled person.

In some embodiments, there is a support actuation mechanism 306 for actuating the support assembly 300 to move the source substrate 302 for the end effectors 206 to pick up the singulated components 102. Specifically, the support actuation mechanism 306 moves the source substrate 302 to position the next singulated component 102 for picking by the next end effector 206. The support actuation mechanism 306 may be part of the support assembly 300 or separately connected to the support assembly 300. For example, the support actuation mechanism 306 is coupled to or integrated with the support portion 304 to actuate the support portion 304, thereby moving the source substrate 302. In some embodiments, the support assembly 300 includes an ejection mechanism (which may cooperate with the support portion 304) to assist the end effector 206 in picking up the components 102. For example, the ejection mechanism may include an ejector pin for pushing the component 102 from the source substrate 302 vertically towards the end effector 206. Such an ejection mechanism can be configured in a manner readily understood by the skilled person.

The component transfer assembly 400 is arranged to support a component transfer medium 402 for receiving the singulated components 102 from the end effectors 206. The end effectors thus transfer the singulated components 102 from the source substrate 302 to the component transfer medium 402. In many embodiments, the component transfer medium 402 is a film or membrane, such as a die attach film mounted on a film frame on which the components 102 to be released can be easily attached to. There are various types of die attach films suitable for the semiconductor components 102, as will be readily understood by the skilled person.

The component transfer assembly 400 may include a holding portion 404 for securely holding the component transfer medium 402. In some embodiments, the holding portion 404 includes a porous portion formed in the interior of the holding portion 404 which are exposable to negative pressures or positive pressures for facilitating the mating of the component transfer medium 402 onto the surface of the holding portion 404. Negative pressure at the holding portion 404 can be activated to hold the component transfer medium 402 for placement of the components 102, and deactivated to release the component transfer medium 402 for transferring to subsequent processing stages. The porous portion is in fluid communication with a vacuum source. The negative pressure enables the component transfer medium 402 to be held tight and substantially flat against the holding portion 404. This prevents or at least reduces sagging of the component transfer medium 402 due to the collective weight of the components 102 placed on the bottom retention surface of the component transfer medium 402. This arrangement advantageously ensures that the vertical position and height of the component transfer assembly 400 with respect to the turret assembly 200 is not or is minimally affected by the sagging of the component transfer medium 402. Although a porous portion is described for the holding portion 404, it will be appreciated that there may be other means for engaging or holding the component transfer medium 402 to prevent or reduce sagging thereof.

In some embodiments, there is a component transfer actuation mechanism 406 for actuating the component transfer assembly 400 to move the component transfer medium 402 for the end effectors 206 to place the singulated components 102. Specifically, the component transfer actuation mechanism 406 moves the component transfer medium 402 to position it for placing the next singulated component 102 by the next end effector 206. The component transfer actuation mechanism 406 may be part of the component transfer assembly 400 or separately connected to the component transfer assembly 400. For example, the component transfer actuation mechanism 406 is coupled to or integrated with the holding portion 404 to actuate the holding portion 404, thereby moving the component transfer medium 402.

Figure 2:
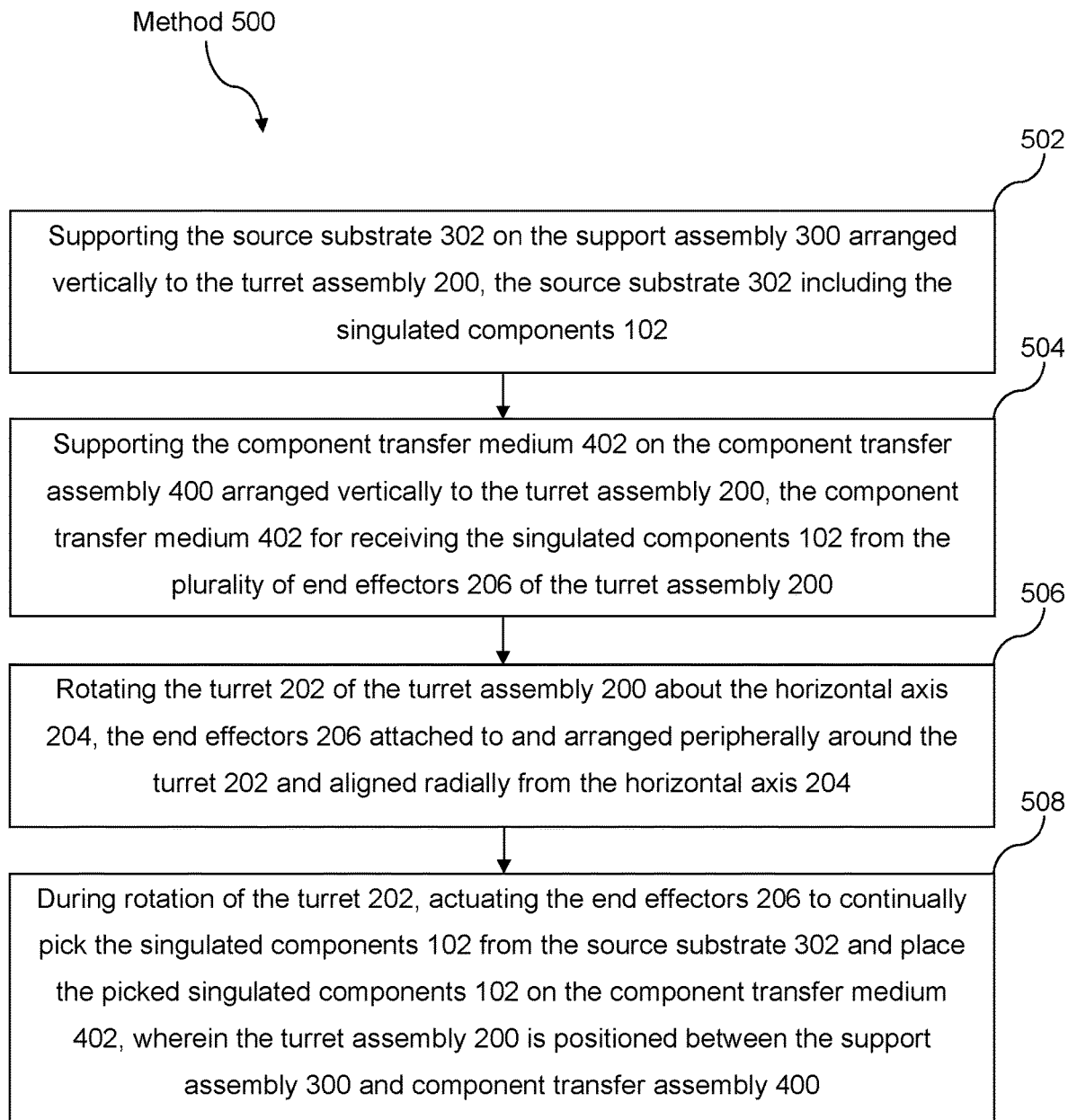
FIG. 2 is a flowchart illustration of a method for handling components, in accordance with some embodiments of the present disclosure.

In representative or exemplary embodiments of the present disclosure, there is a method 500 performed by the system 100 for handling the components 102, with reference to FIG. 2. In a step 502, the source substrate 302 is supported on the support assembly 300 arranged vertically to the turret assembly 200, the source substrate 302 including the singulated components 102. In a step 504, the component transfer medium 402 is supported on the component transfer assembly 400 arranged vertically to the turret assembly 200, the component transfer medium 402 for receiving the singulated components 102 from the plurality of end effectors 206 of the turret assembly 200.

In a step 506, the turret 202 of the turret assembly 200 is rotated about the horizontal axis 204, the end effectors 206 attached to and arranged peripherally around the turret 202 and aligned radially from the horizontal axis 204. In a step 508, during rotation of the turret 202, the end effectors 206 are actuated to continually pick the singulated components 102 from the source substrate 302 and place the picked singulated components 102 on the component transfer medium 402.

The turret assembly 200, which is disposed between the support assembly 300 and component transfer assembly 400, is thus configured to retrieve and release the components 102, using the end effectors 206, directly from the source substrate 302 onto the component transfer medium 402. In many embodiments, the turret assembly 200 retrieves the components 102 from the support assembly 300 disposed below it and transfers the components 102 to the component transfer assembly 400 disposed above it. The retrieval and release of the components 102 are performed during continuous rotations of the turret 202, pausing at intervals during picking and placing of the components 102 so that they are continually transferred while the turret 202 rotates.

The turret 202 may be configurable to rotate in a clockwise or anti-clockwise manner, although various parts of the system 100 may be rearranged according to the direction of rotation. The turret 202 may also be configurable to adjust its rotational speed. During rotation of the turret 202, the turret 202 pauses rotation at the loading position for picking a component 102 and at the unloading position for placing the component 102. While the turret 202 rotates continuously from the loading position to the unloading position to transfer the component 102 from the support assembly 300 to the component transfer assembly 400, the turret 202 may pause the rotation at various stages or steps during the transfer, such as to performing other processes on the component 102 during the transfer. In some embodiments, the rotation is paused at a position between the loading and unloading positions, such as an image capture position for alignment as will be described further below.

In some embodiments, the turret 202 is substantially circular such that the end effectors 206 are equidistant radially from the horizontal axis 204. The horizontal axis 204 is located on the XZ-plane with respect to or parallel to the ground. The arrangement of the rotatable turret 202 advantageously reduces the area footprint on the ground and enables the system 100 to become more compact. Another advantage of rotating the turret 202 about the horizontal axis 204 is that the turret assembly 200 is less affected by vibrations that tend to occur in vertical-axis turrets caused by vertical forces in the end effectors during the retrieval/picking and release/placing steps. The turret assembly 200 includes an actuation mechanism such as a rotary actuator or other types of actuation mechanism and optionally in cooperation with a transmission mechanism for rotating the turret 202. In many embodiments, the turret assembly 200 includes a motor for rotating the turret 202. The motor may be battery-powered or electricity-powered and may be a stepper motor or servo motor. The motor or actuation mechanism is configured to rotate the turret 202 in a controlled manner so that the turret 202 rotates and pauses at intervals for picking and placing of the components 102. It will be appreciated that there can be other types of motors or actuation mechanisms for effecting rotation or angular displacement of the turret 202.

The turret assembly 200 may be configurable to hold the desired number of end effectors 206 on the turret 202. The number of end effectors 206 may be predetermined to meet the desired throughput of the system 100, such as two, three, or four end effectors 206 attached to arranged peripherally around the turret 202. Having a greater number of end effectors 206 increases the throughput as the turret 202 rotates through smaller angular displacements between successive end effectors 206, thus increasing the rate of retrieval and release of the singulated components 102 by the end effectors 206. It will be appreciated that the number of end effectors 206 can be calculated by the skilled person based on the desired throughput.

Additionally, the turret assembly 200 may be configurable for a range of radii for the turret 202, such that the end effectors 206 are configurable to rotate about the horizontal axis 204 at a shorter or longer radius, depending on the arrangement of various parts of the system 100. The turret 202 may be designed to include certain features or elements for reducing its weight and/or inertial mass to improve efficiency of the turret assembly 200. Such design features or elements will be readily understood by the skilled person.

Figure 3:
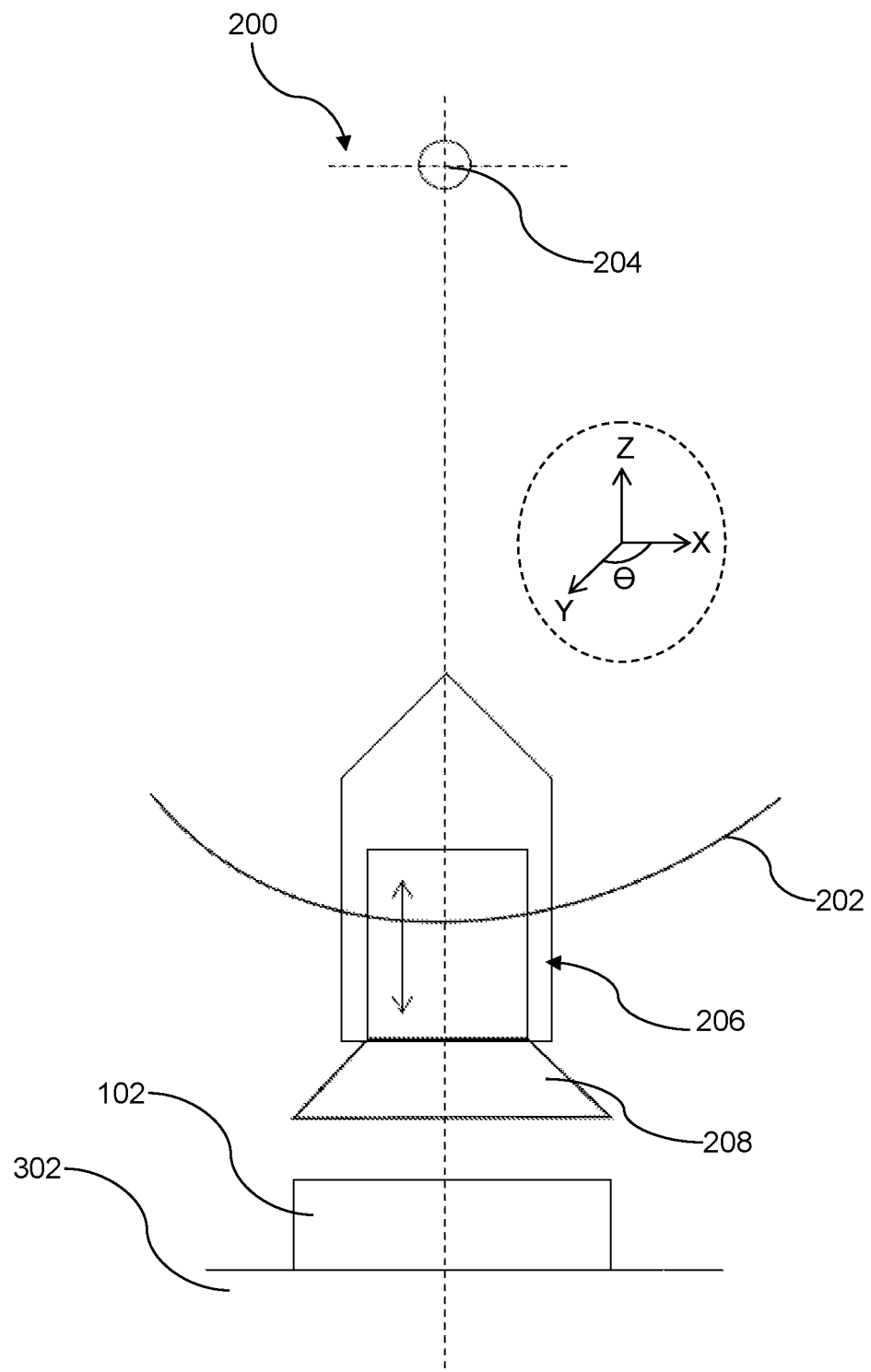
FIG. 3 is a schematic illustration of an end effector for handling components, in accordance with some embodiments of the present disclosure.

With reference to FIG. 3, each end effector 206 includes a pickup head 208 for picking and placing the singulated components 102. In some embodiments, the pickup head 208 includes a suction tip or nozzle, or any other suitable type of component gripper for retrieving, holding, and releasing the components 102, as will be readily understood by the skilled person. For example, each pickup head 208 is a suction nozzle that is fluidly connected to a fluidic source (e.g. pneumatic or hydraulic or a combination thereof) so that negative and positive fluidic pressure, e.g. vacuum pressure, can be actuated to retrieve and release a component 102.

The pickup head 208 may exert a predetermined force on the component 102 at the point of contact with the component 102 during the retrieval step. This force allows the component 102 to be stably held or gripped by the pickup head 208 to prevent or mitigate risk of dislodgment of the component 102. If this force was absent, such dislodgement may occur due to misalignment of the component 102 of the source substrate 302, which may result in poor contact between the pickup head 208 and the component 102 and the component 102 not being properly held by the pickup head 208. The misalignment may include one or more of misalignments of the source substrate 302 along the X-axis, Y-axis, and/or tilt angle on the XY-plane, with respect to the support assembly 300.

A sensor may be located on the pickup head 208 configured for measuring the force exerted by the pickup head 208 on the component 102 during the retrieval step. The force can be adjusted based on the sensor measurement, such as by increasing it to stabilize the holding of the component 102 by the pickup head 208 or by decreasing it to avoid application of excessive force on the component 102, the latter which may result in damaging the component 102.

The singulated components 102 are individually picked up or retrieved from the source substrate 302 by the end effectors 206 from a top-down direction. When an end effector 206 is at the loading position with respect to a component 102 of the source substrate 302, the pickup head 208 is moveable vertically from a standby position to a pickup position through a predetermined distance to enable retrieval of the component 102, as shown in FIG. 3. As the end effectors 206 orientated in a radial direction away from the centre of the turret 202, the force exerted on the component 102 by each pickup head 208 is substantially transferred through the centre of the turret 202 and the horizontal axis 204. Unbalanced forces, which tend to occur in vertical-axis turrets with vertically oriented end effectors, are reduced substantially to thereby reduce disturbances such as shocks and vibrations to other parts of the system 100. The reduced disturbances consequently minimize extraneous movements of the end effectors 206 during the retrieval and release steps. The singulated components 102 can thus be retrieved by the end effectors 206 without substantial risk of dislodgment from the pickup heads 208 during the retrieval step.

At the loading position at the source substrate 302 during the retrieval step, the pickup head 208 is in a downward facing direction with respect to the top retention surface of the singulated component 102, and the singulated component 102 is lying in a substantially flat position corresponding to the horizontal XY-plane. At the unloading position at the component transfer medium 402 during the release step, the pickup head 208 is in an upward facing direction with respect to the bottom retention surface of the component transfer medium 402, and the component transfer medium 402 is lying in a substantially flat position corresponding to the horizontal XY-plane. In this arrangement, the retention surface of the component transfer medium 402 is in a downward facing direction and directly facing the top retention surface of the source substrate 302 which is in an upward facing direction.

In many embodiments, the end effectors 206 are equi-angularly positioned on the periphery of the turret 202. Equi-angularly spacing the end effectors 206 apart from each other with respect to the horizontal axis 204 substantial maintains weight balance of the turret assembly 200. For example, in one instance of the rotation, one end effector 206 is at the loading position while another end effector 206 is at the unloading position, the overall weight of the turret assembly 200 being substantially balanced with respect to the horizontal axis 204.

Figure 4:
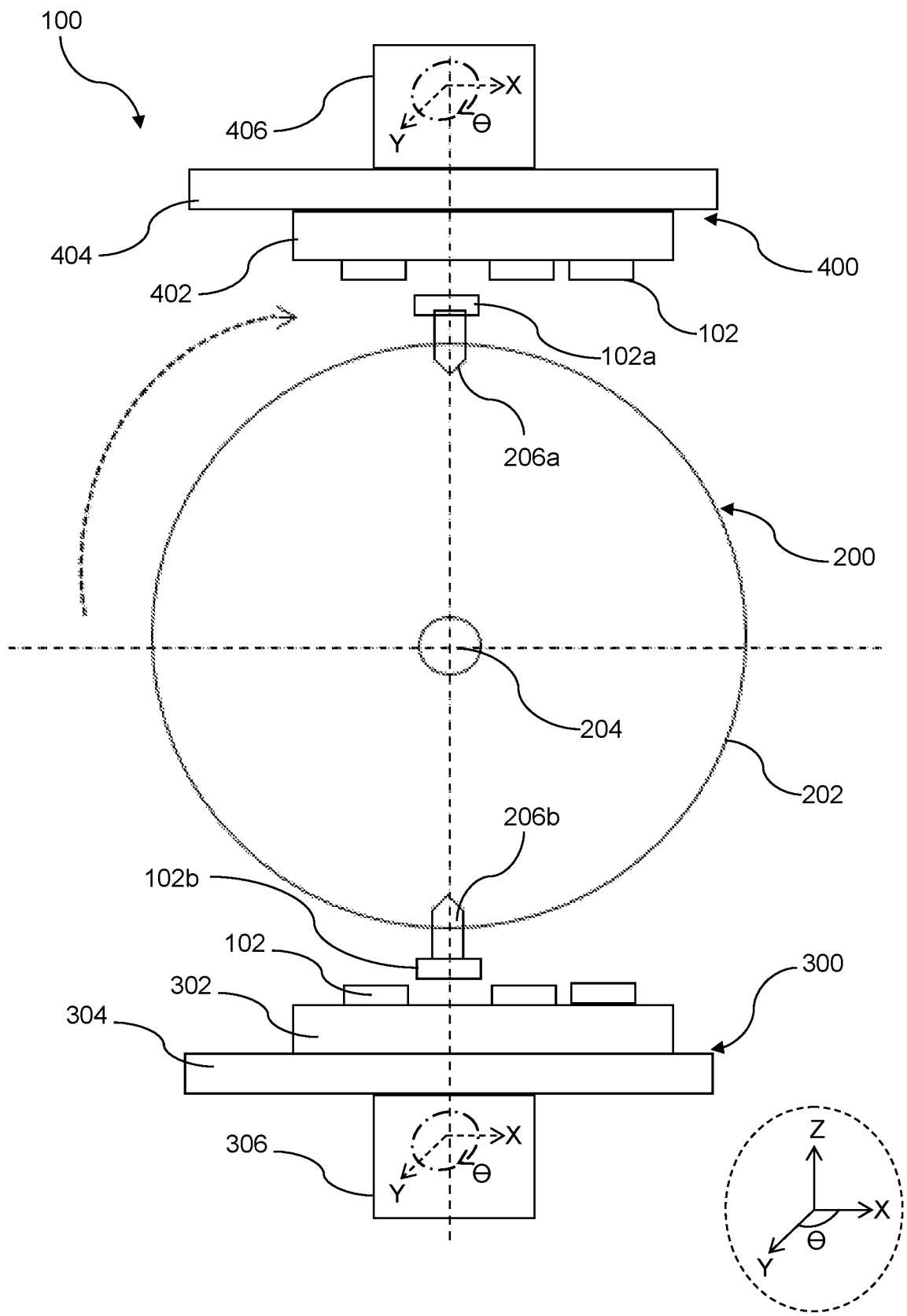
FIG. 4 is another schematic illustration of a system for handling components, in accordance with some embodiments of the present disclosure.

In some embodiments as shown in FIG. 4, there is a first end effector 206a and a second end effector 206b directly opposing each other, i.e. the end effectors 206ab are positioned at 180° apart from each other. Both the end effectors 206ab are structurally configured in a similar manner and their spatial configurations relative to the turret 202 are similar as well. For example, when the first end effector 206a is in the unloading position at the top of the turret 202 to place a first singulated component 102a on the component transfer medium 402, the second end effector 206b is in the loading position at the bottom of the turret 202 to pick a second singulated component 102b from the source substrate 302. Rotation of the turret 202 is paused to allow the first singulated component 102a to be placed on the component transfer medium 402 and the second singulated component 102b to be picked from the source substrate 302. Subsequently, the turret 202 resumes rotation to move the second end effector 206b and the held second singulated component 102b to the unloading position at the component transfer medium 402, and at the same time move the first end effector 206a to the loading position at source substrate 302. The second singulated component 102b is ready to be placed on the component transfer medium 402 and the first end effector 206a is ready to pick up another singulated component 102.

Accordingly, the first end effector 206a and the second end effector 206b are rotated along with the turret 202 such that in one instance of the turret rotation, the first end effector 206a is in position to vertically place the first singulated component 102a on the component transfer medium 402, such as in a bottom up direction, and the second end effector 206b is in position to vertically pick the second singulated component 102b from the source substrate 302, such as in a top down direction.

In some embodiments as shown in FIG. 1, the turret assembly 200 includes four end effectors 206a-d equi-angularly positioned around the turret 202, i.e. at 90° apart from each other. In some embodiments, the turret assembly 200 includes three end effectors 206a-c equi-angularly positioned around the turret 202, i.e. at 120° apart from each other. However, it will be appreciated that the end effectors 206 may be spaced at varying angular distances apart. For example, in the turret assembly 200 with three end effectors 206a-c, the first and second end effectors 206ab may be angularly spaced apart by 180°, the second and third end effectors 206bc may be angularly spaced apart by 90°, and the first and third end effectors 206ac may be angularly spaced apart by 90°.

Figure 5:
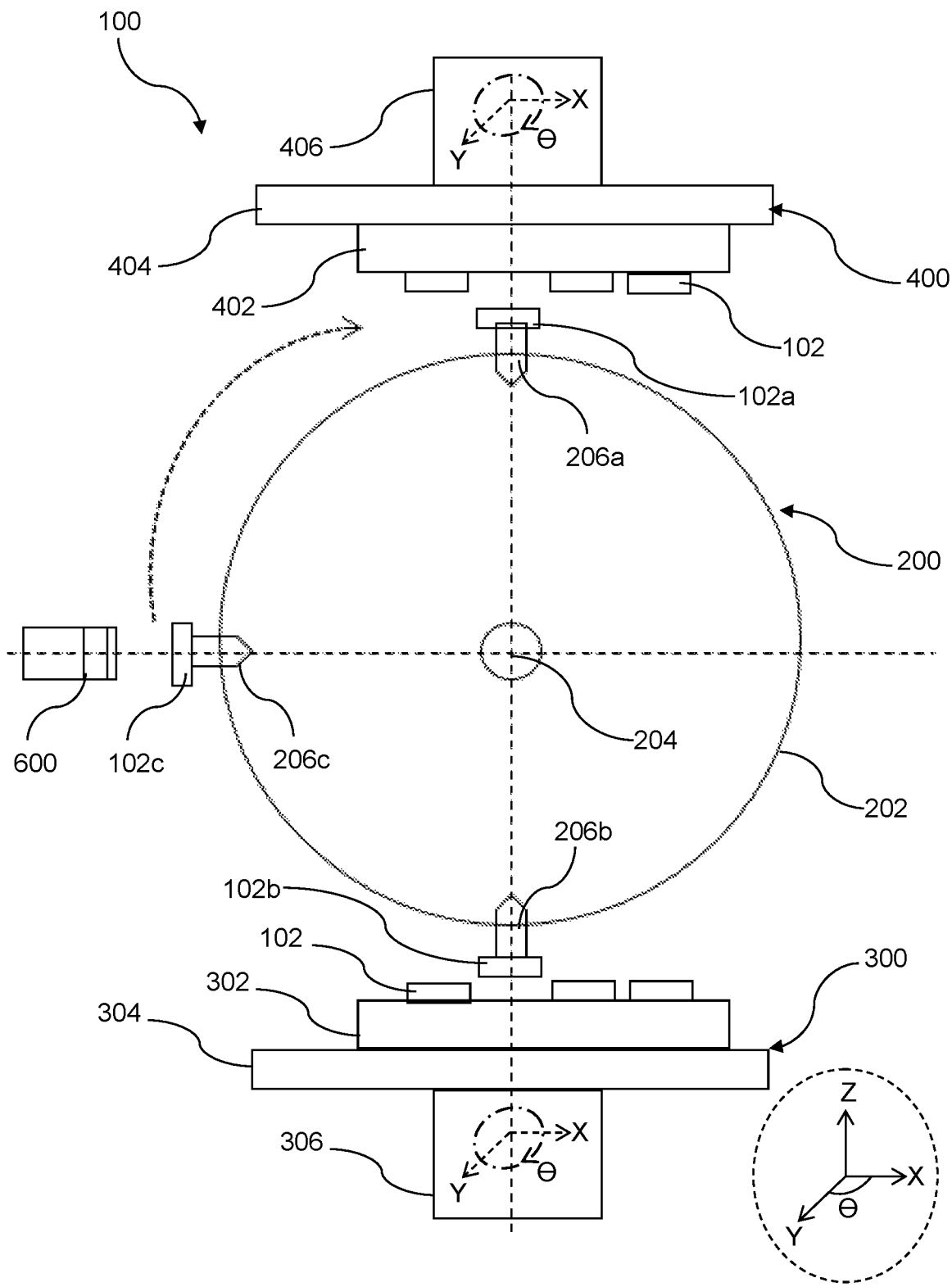
FIG. 5 is another schematic illustration of a system for handling components, in accordance with some embodiments of the present disclosure.
Figure 6:
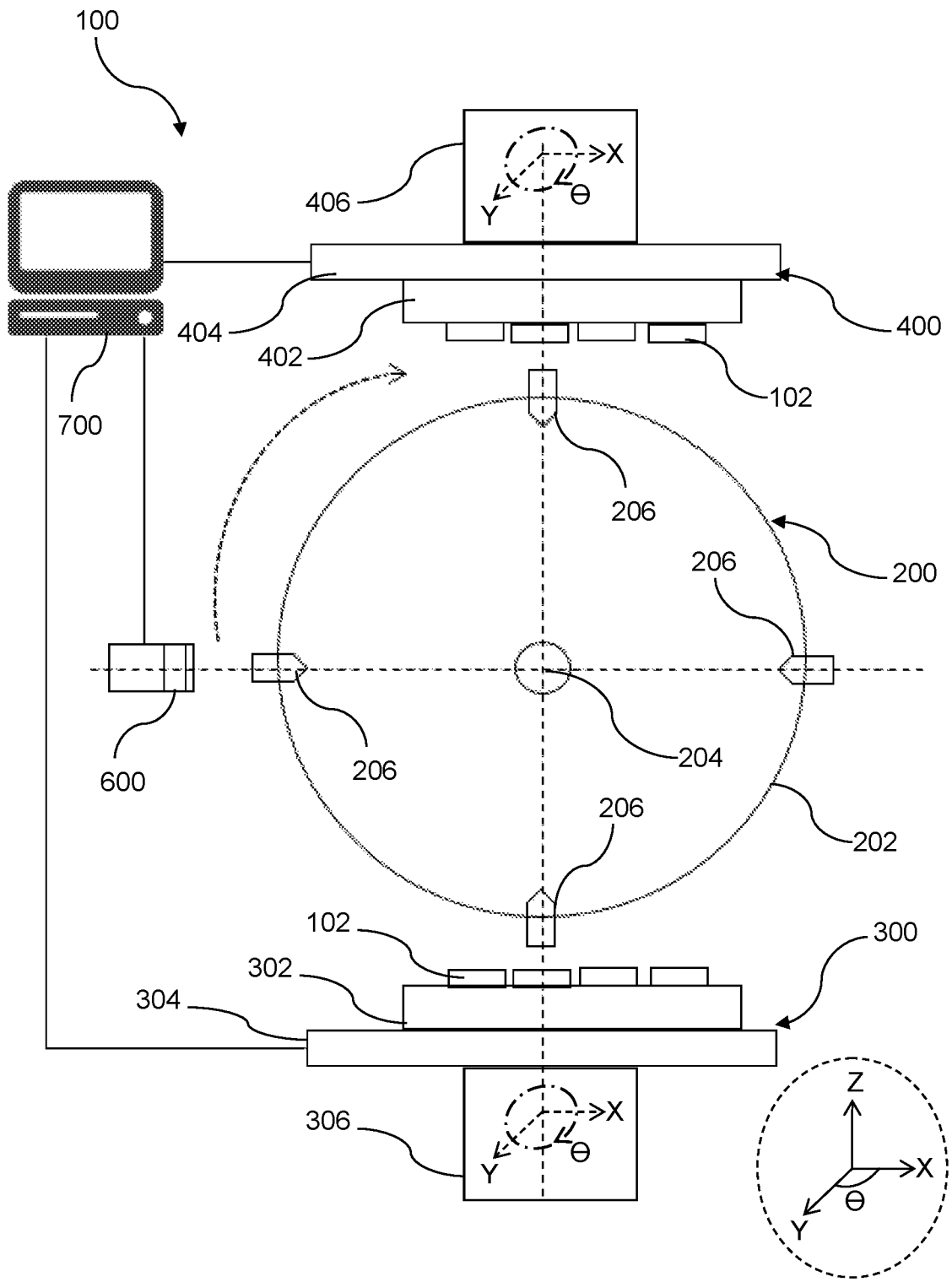
FIG. 6 is another schematic illustration of a system for handling components, in accordance with some embodiments of the present disclosure.

In some embodiments as shown in FIG. 5 and FIG. 6, the system 100 further includes an image capture device 600 configured for capturing images of the singulated components 102 held by the end effectors 206 during rotation of the turret 202. During the image capture of each singulated component 102, the component 102 may be in motion (the turret 202 rotates continuously) or momentarily stationary (the turret 202 pauses rotation). The image capture device 600 may be aligned radially from the horizontal axis 204. Specifically, the image capture device 600 may be positioned in any suitable or ergonomic location in a radial direction facing towards the centre of the turret 202. For example, the image capture device 600 is aligned to the X-axis and directly facing the end effector 206 in an image capture position for image capture of the singulated component 102 held by the end effector 206. This arrangement enables the image capture device 600 to capture a good image of the bottom surface of the singulated component 102 as the surface is aligned to the centre of the field of view of the image capture device 600. It will be appreciated that the image capture device 600 may be positioned differently or rearranged according to the direction of rotation of the turret 202.

The system 100 may include an illumination device for facilitating capturing of clearer and more accurate images of the singulated components 102. The illumination device may include one or more of ring light, xenon lamp, light emitting diode (LED) lamp, or white light. The illumination intensity from the illumination device may be varied as desired.

The system 100 may further include a computer system 700 communicatively linked to the image capture device 600. The computer system 700 includes an image processing module for processing the captured images of the singulated components 102. In some embodiments, the image processing module is configured to detect that the bottom surface of a singulated component 102 is aligned to the centre of the field of view of the image capture device 600, and to capture one or more images of the bottom surface of the singulated component 102 in response to positive detection of said alignment. The computer system 700 may include a data storage module (e.g. hard disk drive, solid state drive, or memory device) for storing the captured images. Additionally, the image processing module is configured to calculate misalignment of the held singulated components 102 based on the captured images, as will be described further below.

The computer system 700 includes one or more computers, laptops, mini-computers, mainframe computers, any non-transient and tangible machines that can execute a machine-readable code, cloud-based servers, distributed server networks, and a network of computer systems. The computer system 700 may be implemented in hardware or software, or a combination thereof. Additionally, the computer system 700 includes a processor, a memory, and various other modules or components. The modules and components thereof are configured for performing various operations or steps and are configured as part of the processor. Such operations or steps are performed in response to non-transitory instructions operative or executed by the processor. The memory is used to store instructions and perhaps data which are read during program execution. The memory may be referred to in some contexts as computer-readable storage media and/or non-transitory computer-readable media. Non-transitory computer-readable media include all computer-readable media, with the sole exception being a transitory propagating signal per se.

In some embodiments, the computer system 700 stores on the data storage module a digital map or dataset of the source substrate 302. The digital map identifies locations of the singulated components 102 relative to the source substrate 302. Additionally, the digital map may identify locations of defective singulated components 102. Specifically, the digital map provides a record of which of the components 102 of the source substrate 302 are good and which are defective. This may be dependent on the results of electrical tests and visual inspections that may be performed during front-end and back-end processing before the components 102 are transferred from the source substrate 302. The digital map of the source substrate 302 is continually updated during front-end and back-end processing, particularly after each set of electrical tests and visual inspections to which the source substrate 302 is subjected. Within the digital map, a data field corresponding to the position of each singulated component 102 is updated with a specific and distinct data element. This data element describes at least whether the singulated component 102 is electrically good or bad and whether it is visually good or defective. The good or non-defective components 102 are transferred from the source substrate 302 to the component transfer medium 402 while the defective components 102 are discarded.

Multiple source substrates 302 may be stored on a storage medium, such as a wafer stack, prior to transfer to the support assembly 300. Each source substrate 302 has an associated identifier, such as an optical code, and each digital map of the source substrate 302 is digitally linked to the identifier. Some non-limiting examples of the optical code include Quick Response (QR) code, barcode, EZcode, high capacity colour barcode, ShotCode, MaxiCode, GTIN12 code, GTIN-13 code, and Aztec code. The identifier may be a physical one such as a substrate identification number or barcode engraved or tagged onto a surface of the source substrate 302, such as at a peripheral surface of the source substrate 302 to provide identification thereof.

Prior to the source substrate 302 being transferred to the support assembly 300, the digital map of the source substrate 302 may be provided to determine the locations of the singulated components 102 to be retrieved. Each location is determined in X-Y-θ coordinates, i.e. linear position along the X-axis and Y-axis and the angular position a on the horizontal XY-plane. The X-Y-θ coordinates of each singulated component 102 are referenced to a predefined datum.

When a singulated component 102 of the source substrate 302 is picked by an end effector 206 and moved to the image capture position, such as the third end effector 206c holding the third singulated component 102c as shown in FIG. 5, the image capture device 600 captures one or more images of the bottom surface of the singulated component 102. Further in the example shown in FIG. 5, the first end effector 206a, second end effector 206b, and third end effector 206c are rotated along with the turret 202. In one instance of the turret rotation, the first end effector 206a is in position to vertically place the first singulated component 102a on the component transfer medium 402 in a bottom up direction, the second end effector 206b is in position to vertically pick the second singulated component 102b from the source substrate 302 in a top down direction, and the third end effector 206c is holding the third singulated component 102c and is in position for capturing one or more images of the third singulated component 102c.

The captured images are communicated to the computer system 700 and the calculation module thereof calculates the actual position of the singulated component 102 based on the captured images. The actual position is in the X-Y-θ coordinates referenced to the predefined datum of the digital map of the source substrate 302. Although the image capture device 600 is described for capturing the images for calculating the actual position, there may be other means of measuring or determining the actual position and coordinates of the singulated component 102, as will be readily understood by the skilled person.

The calculation module then compares the actual position of the singulated component 102 to the reference position of the same singulated component 102 from the digital map. Based on this comparison, the calculation module calculates misalignment of the singulated component 102 relative to the digital map of the source substrate 302, and calculates the correct position for placing the singulated component 102 on the component transfer medium 402.

The misalignment between the actual position of the singulated component 102 and its reference position from the digital map may be corrected by actuating the component transfer assembly 400 to thereby move the component transfer medium 402 before placing the singulated component 102 on the component transfer medium 402. In some embodiments, the component transfer actuation mechanism 406 actuates the component assembly 400 to move the component transfer medium 402 for correcting the misalignment.

The computer system 700 includes an actuation control module for controlling the component transfer actuation mechanism 406 to correct the misalignment which includes X-Y-θ deviations (deviations along the X-axis, Y-axis, and/or tilt angle on the XY-plane). The component transfer actuation mechanism 406 is configured to actuate the component transfer assembly 400 and move the component transfer medium 402 along the X-axis, Y-axis, and/or tilt angle on the XY-plane. The component transfer actuation mechanism 406 can thus align the component transfer medium 402 to the singulated component 102 by correcting or compensating for the X-Y-θ deviations of the misalignment calculated above. Each singulated component 102 can subsequently be accurately placed at the correct position on the component transfer medium 402.

In some embodiments, the component transfer actuation mechanism 406 is further configured to actuate the component transfer assembly 400 and move the component transfer medium 402 vertically along the Z-axis. This may be done to adjust the vertical distance between the component transfer medium 402 and the end effector 206 before the end effector 206 places the singulated component 102 on the component transfer medium 402. Additionally, the vertical distance between the end effector 206 and the component transfer medium 402 may differ, such as depending on the thickness of the component transfer medium 402. The component transfer actuation mechanism 406 may actuate the component transfer assembly 400 and thereby move the component transfer medium 402 downwards or upwards to adjust the vertical distance to the end effector 206, such that the end effector 206 is able to properly place the singulated component 102 on the component transfer medium 402.

In some embodiments, the support actuation mechanism 306 actuates the support assembly 300 to align the singulated components 102 of the source substrate 302 to the end effectors 206. The support assembly 300 may be actuated to compensate for any misalignment determined from the digital map of the source substrate 302.

The actuation control module is configured for controlling the support actuation mechanism 306 to actuate the source substrate 302 along the X-axis, Y-axis, and/or tilt angle on the XY-plane. The support actuation mechanism 306 can thus align the singulated components 102 to the end effectors 206 by actuating the support assembly 300 to move the support substrate 302 and thereby centre the singulated components 102 of the source substrate 302 to the pickup heads 208 of the end effectors 206. Each singulated component 102 can subsequently be accurately picked at the correct position of the source substrate 302. Such a support assembly 300 can thus carry, securely retain, and accurately position the source substrate 302 in a manner readily understood by the skilled person.

In some embodiments, the support actuation mechanism 306 is further configured to actuate the support assembly 300 and move the support substrate 302 vertically along the Z-axis. This may be done to adjust the vertical distance between the source substrate 302 and the end effector 206 before the end effector 206 picks the singulated component 102 from the source substrate 302. Additionally, the vertical distance between the end effector 206 and the source substrate 302 may differ, such as depending on the thickness of the source substrate 302. The support actuation mechanism 306 may actuate the support assembly 300 and thereby move the support substrate 302 downwards or upwards to adjust the vertical distance to the end effector 206, such that the end effector 206 is able to properly pick the singulated component 102 from the source substrate 302.

In many embodiments, the source substrate 302 has undergone inspections before the components 102 are transferred from the source substrate 302 to the component transfer medium 402. There may be inspections that are performed on the source substrate 302 before the source substrate 302 is transferred to the support assembly 300, or when the source substrate 302 is already placed on the support assembly 300 but before the components 102 are positioned to the end effectors 206 for picking. During these inspections, the digital map of the source substrate 302 is constantly updated for accurate correction of misalignments during transfer of the components 102 from the source substrate 302 to the to the component transfer medium 402.

In some embodiments, the system 100 does not include the image capture device 600. The computer system 700 thus performs correction of misalignments based on the digital map of the source substrate 302 and without processing any captured images of the singulated components 102. This is possible as the digital map is constantly updated during the inspections and the actual coordinates of the singulated components 102 can be accurately derived from the digital map. In these embodiments, it is not necessary for the image capture device 600 to capture images of the singulated components 102 for correction of misalignment. Using the digital map, the actuation control module controls the support actuation mechanism 306 to actuate the support assembly 300 and move the source substrate 302 to position the singulated components 102 accurately under the end effectors 206, i.e. the centre of each singulated component 102 is directly below the respective end effector 206. The singulated components 102 can therefore be transferred directly to the component transfer medium 402 with minimal intervening steps as misalignment of the singulated components 102 will be minimal.

In some embodiments, the source substrate 302, such as a film frame holding the singulated components 102, has undergone a stretching process which stretches the singulated components 102 apart on the source substrate 302. This stretching process may be performed to increase the intercomponent separation or gap to facilitate picking by the end effectors 206. As a result of the stretching process, the actual coordinates of each singulated component 102 deviate from that stored on the digital map. In these embodiments, the system 100 includes the image capture device 600 which cooperates with the computer system 700 to perform correction of misalignments based on the digital map. During transfer of the singulated components 102, the image capture device 600 captures one or more images of each singulated component 102 and the captured images are processed to correct misalignment of the singulated component 102, as described above.

The computer system 700 may be connected to one or more other parts of a broader semiconductor manufacturing system, such as including another component handler, die sort apparatus, system controller, and the like, by way of a communication network or interface. The computer system 700 may be able to receive, retrieve, or access the digital maps of the source substrates 302 where the singulated components 102 are to be transferred from, as well as other data relevant to processing of the components 102.

The system 100 is preferably automatically operated by the computer system 700, such as in cooperation with the semiconductor manufacturing system. Each of the end effectors 206 located around the periphery of the rotating turret 202 is capable of transporting the singulated components 102 from a retrieval or loading position, where the singulated components 102 are picked up from the source substrate 302, to a release or unloading position where the singulated components 102 are placed onto the component transfer medium 402. The rotation of the turret 202 about the horizontal axis 204 progressively moves each singulated component 102 from the loading position to the unloading position, such that the end effectors 206 are able to continually pick the singulated components 102 from the source substrate 302 and place the picked singulated components 102 on the component transfer medium 402.

The loading position and the unloading position are located along a vertical line perpendicular to the source substrate 302 and/or component transfer medium 402 such that the source substrate 302 is arranged in a face-to-face orientation with respect to the component transfer medium 402. In this arrangement, when a singulated component 102 is picked by an end effector 206 at the loading position, it is in a top-down orientation meaning that the top surface of the singulated component 102 is facing upwards. When the singulated component 102 is placed by the end effector 206 at the unloading position, it is in a bottom-up orientation meaning that the bottom surface of the singulated component 102 is facing upwards, such that the bottom surface attaches to the component transfer medium 402. This arrangement advantageously allows the singulated components 102 to be transferred directly from the source substrate 302 to the component transfer medium 402 with minimal intervening steps for re-orienting the singulated components 102, such as flipping the components 102.

An exemplary operation of the system 100 for component handling is described below, with reference to FIG. 7A to FIG. 7D which illustrate different stages of the operation. In this operation, the components 102 are semiconductor dies 102 singulated from the source substrate 302 which is a semiconductor wafer 302. The turret assembly 200 includes four end effectors 206a-d equi-angularly positioned around the turret 202. The wafer 302 is supported on the support portion 304 which may be a wafer table 304, and the support assembly 300 is referred to as a wafer table assembly 300. The wafer table assembly 300 further includes the support actuation mechanism 306. The component transfer medium 402 is a die attach film 402 for attaching the dies 102 thereto.

The wafer 302 is first retrieved from a storage medium, such as a wafer stack, by a robotic device, wafer handler, or other means known to the skilled person. The wafer 302 is retrieved and transferred to the support assembly 300 where it is placed on the wafer table 304. The wafer handler or similar means for handling the wafer 302 may be integrated with or as the support assembly 300, or separately cooperative with the support assembly 300. After the wafer 302 is placed on the wafer table 304, the support actuation mechanism 306 is activated to actuate the wafer table 304 and move the wafer 302 to align the first die 102a with the first end effector 206a. Movement of the wafer 302 is determined from the digital map of the wafer for compensating any misalignment between the first end effector 206a and the first die 102a.

Figure 7A:
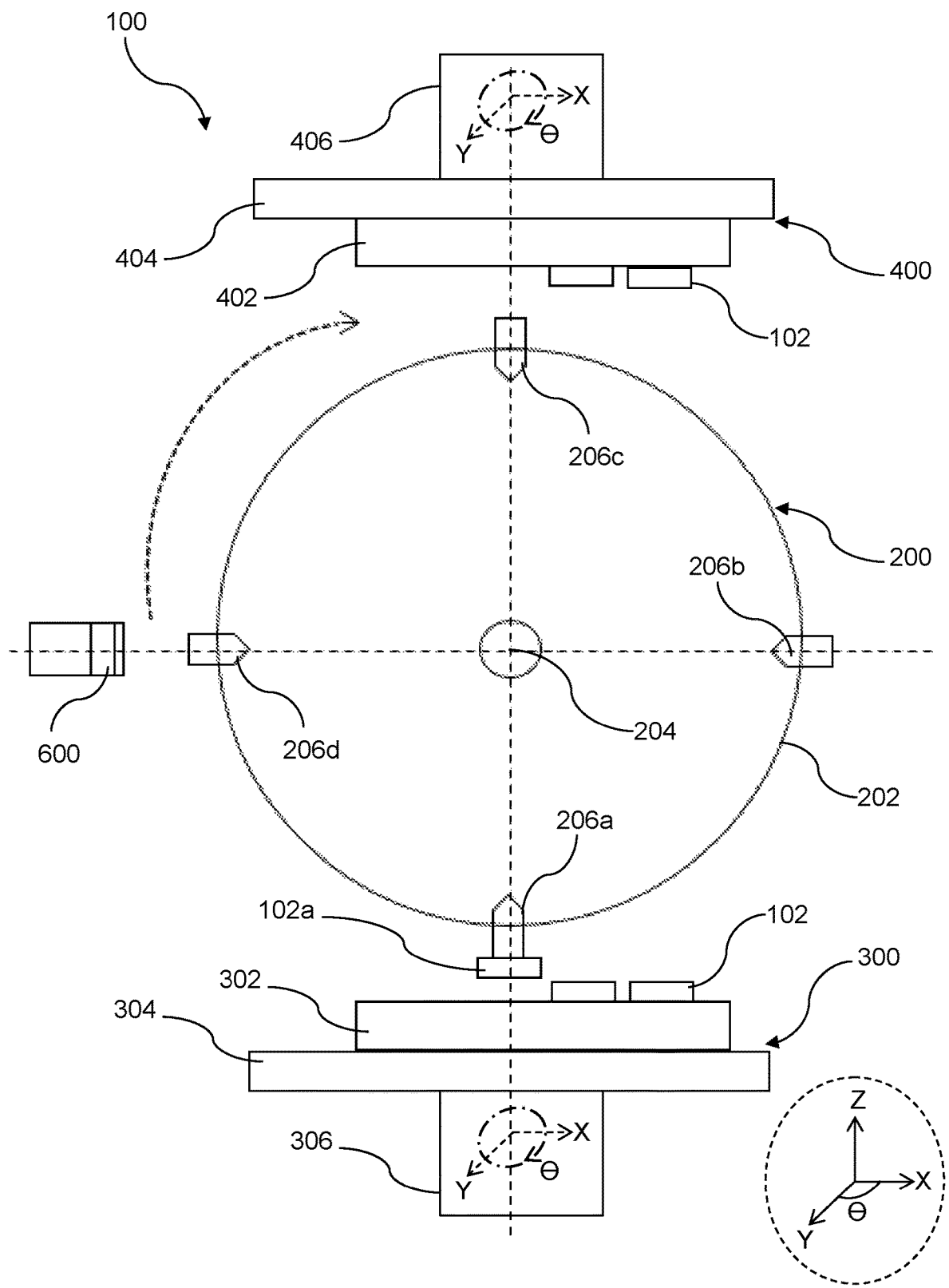
FIG. 7A to FIG. 7D are schematic illustrations of different stages of a system for handling components, in accordance with some embodiments of the present disclosure.
Figure 7B:
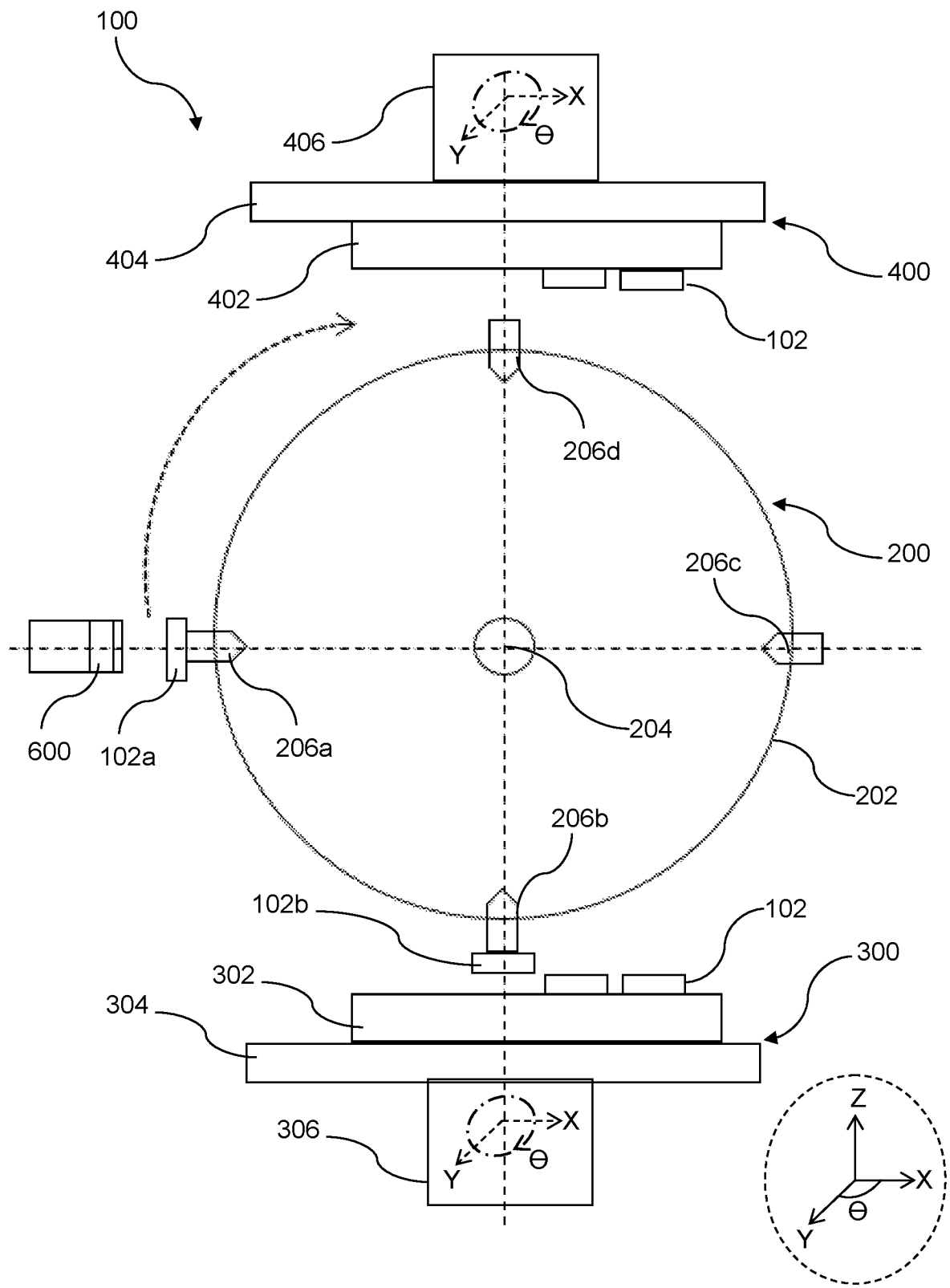

The first end effector 206a is in the loading position to pick up the first die 102a, as shown in FIG. 7A. The turret 202 rotates 90° clockwise to move the picked first die 102a to the image capture position, as shown in FIG. 7B. At the same time, the second end effector 206b is moved to the loading position for picking the second die 102b from the wafer 302.

At the image capture position, the image capture device 600 captures one or more images of the bottom surface of the first die 102a. The calculation module then calculates the actual position of the first die 102a based on the captured images, and further calculates the misalignment between the actual position of the first die 102a and its reference position from the digital map. The actuation control module subsequently controls the component transfer actuation mechanism 406 to thereby correct the misalignment. The component transfer actuation mechanism 406 is activated to actuate the component transfer assembly 400 and move the die attach film 402 to correct the misalignment. At the loading position, the second end effector 206b picks up the second die 102b.

Figure 7C:
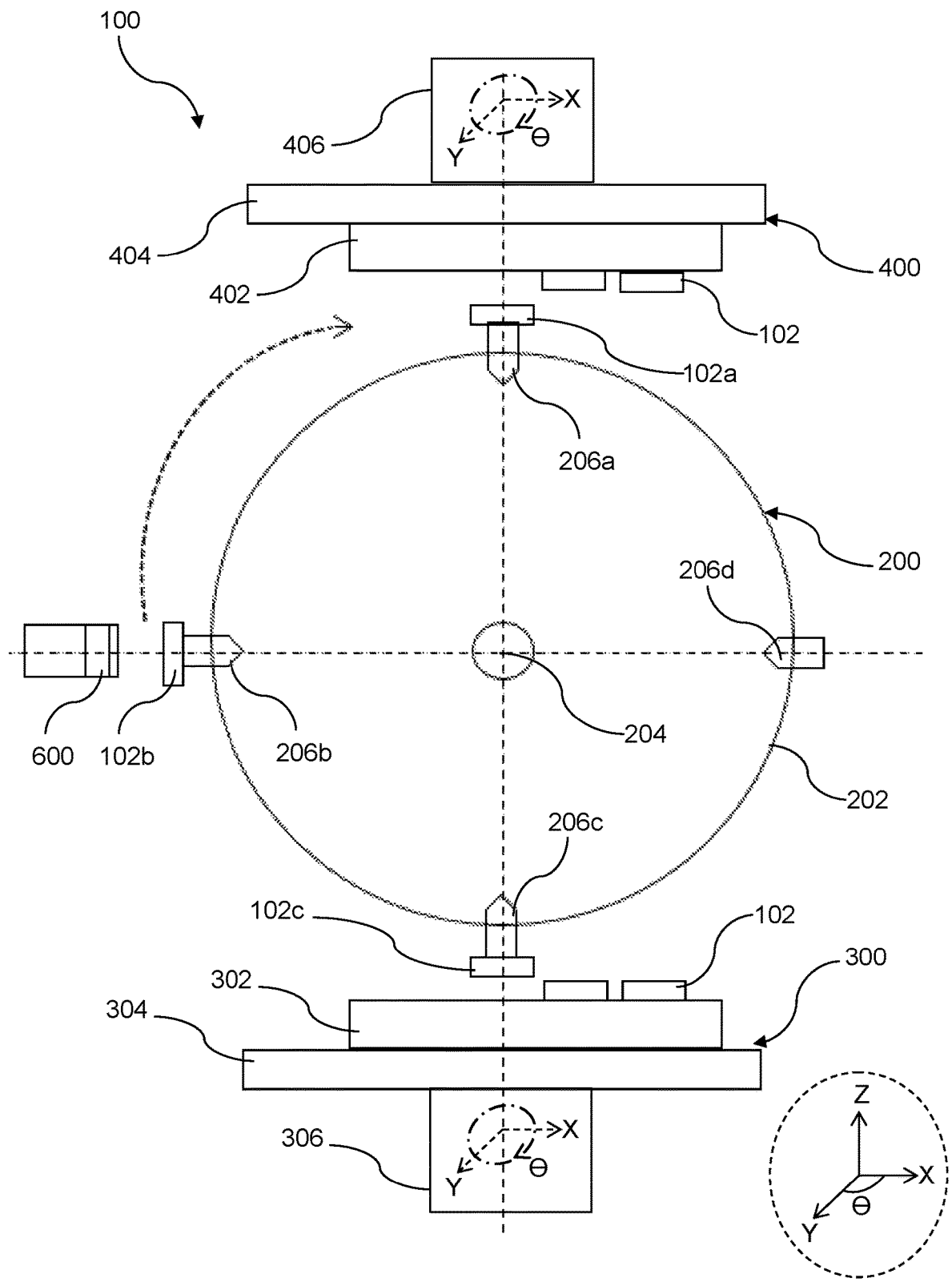

The turret 202 rotates 90° clockwise to move the first die 102a to the unloading position, as shown in FIG. 7C. At the same time, the second die 102b is moved to the image capture position and the third end effector 206c is moved to the loading position for picking the third die 102c from the wafer 302.

At the unloading position, the component transfer assembly 400 has been actuated to move the die attach film 402 to compensate for the misalignment. The first die 102a can thus be accurately placed at the correct position on the die attach film 402. At the image capture position, the image capture device 600 captures one or more images of the bottom surface of the second die 102b. At the loading position, the third end effector 206c picks up the third die 102c.

Figure 7D:
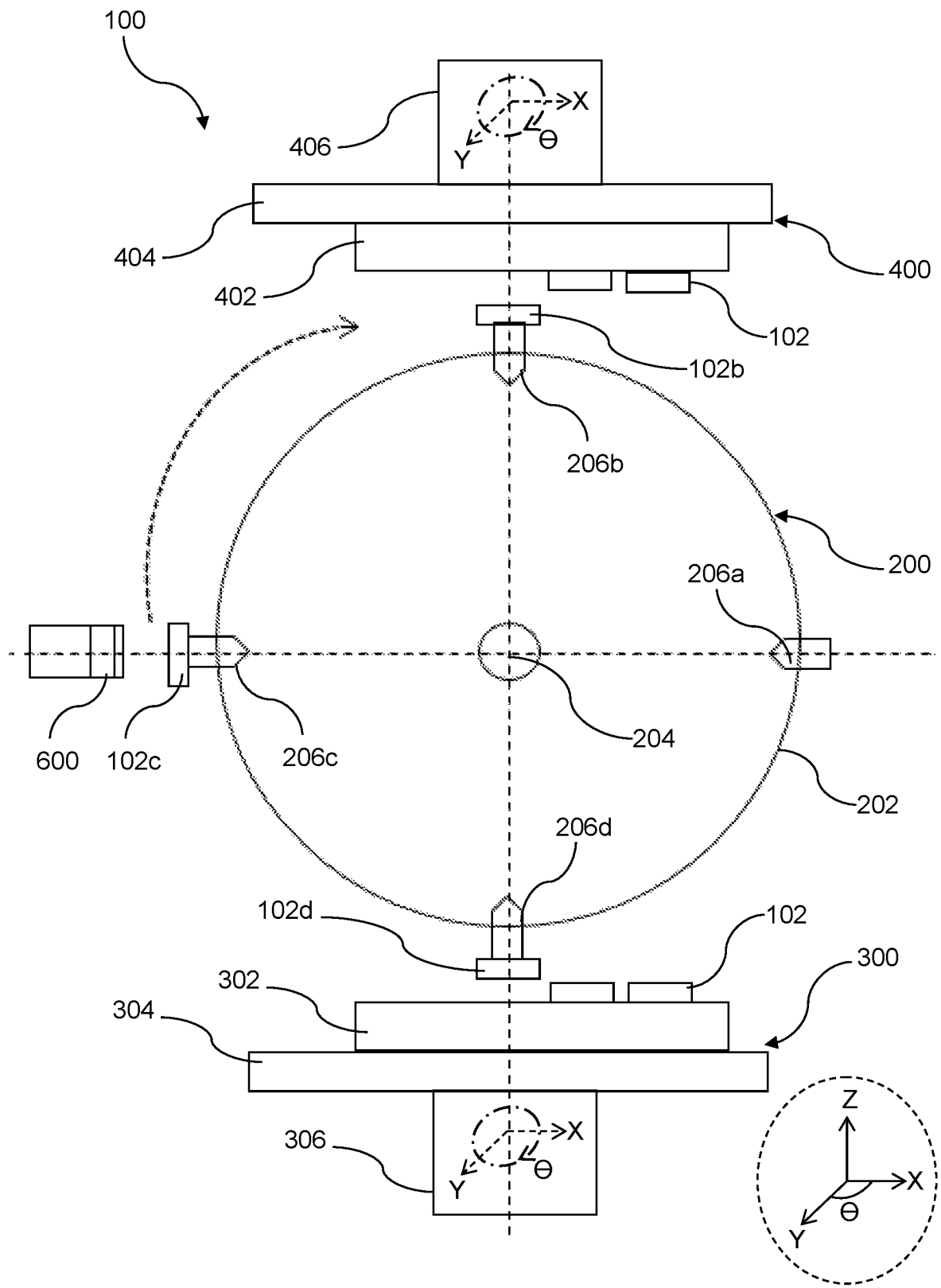

The turret 202 rotates 90° clockwise to move the second die 102b to the unloading position, as shown in FIG. 7D. At the same time, the third die 102c is moved to the image capture position and the fourth end effector 206d is moved to the loading position for picking the fourth die 102d from the wafer 302. It will be appreciated that the above description relating to unloading, aligning, and placing of the first die 102a applies similarly or analogously to the second die 102b, third die 102c, and fourth die 102d, and are not repeated for purpose of brevity. It will also be appreciated that all the dies 102 of the wafer 302 are continually picked and placed by the end effectors 206 in a similar manner through rotation of the turret 202.

As described in various embodiments herein, the system 100 is configured for handling the components 102 by transferring them from the support assembly 300 to the component transfer assembly 400, both of which are arranged vertically to the turret assembly 200. This vertical arrangement allows the components 102 to be transferred directly from the source substrate 302 to the component transfer medium 402 with minimal intervening steps for re-orienting the components 102. This reduces the risk of the components 102 dislodging from the end effectors 206 as there are fewer intervening steps during the transfer. The transferring of the components 102 can be done at high throughput, such as by increasing the number of end effectors 206 of the turret assembly 200, and with high accuracy as misalignments can be corrected by actuating the component transfer assembly 400 to move the component transfer medium 402 before the components 102 are placed thereon. The high throughput and accuracy would increase the efficiency of semiconductor products being manufactured and distributed from a semiconductor facility, potentially resulting in higher revenues.

Various embodiments of the present disclosure have been described in relation to a vertical arrangement wherein the support assembly 300 is disposed below the turret assembly 200 and the component transfer assembly 400 is disposed above the turret assembly 200. However, there may be other embodiments wherein the support assembly 300 is disposed above the turret assembly 200 and the component transfer assembly 400 is disposed below the turret assembly 200. In these embodiments, the turret 202 transfers the components 102 from the source substrate 302 disposed above the turret 202 to the component transfer medium 402 disposed below the turret 202. The end effectors 206 vertically pick the components 102 from the source substrate 302 in a bottom up direction, and vertically place the components 102 on the component transfer medium 402 in a top down direction.

Various parts of the system 100 may be rearranged according to the vertical arrangement, as will be readily understood by the skilled person.

In the foregoing detailed description, embodiments of the present disclosure in relation to a component handler are described with reference to the provided figures. The description of the various embodiments herein is not intended to call out or be limited only to specific or particular representations of the present disclosure, but merely to illustrate non-limiting examples of the present disclosure. The present disclosure serves to address at least one of the mentioned problems and issues associated with the prior art. Although only some embodiments of the present disclosure are disclosed herein, it will be apparent to a person having ordinary skill in the art in view of this disclosure that a variety of changes and/or modifications can be made to the disclosed embodiments without departing from the scope of the present disclosure. Therefore, the scope of the disclosure as well as the scope of the following claims is not limited to embodiments described herein.

The invention claimed is:

1. A system for handling components, the system comprising:
   a turret assembly comprising:
      a turret rotatable about a first axis, and
      a plurality of end effectors attached to and arranged peripherally around the turret, the end effectors aligned radially from the first axis;
   a support assembly arranged to move a source substrate to a retrieval position, the support assembly arranged with respect to the turret assembly such that an end effector of the plurality of end effectors is positioned in a second axis facing a component in an X-Y-θ coordinate position of the source substrate for retrieving the component from the source substrate, wherein the second axis is orthogonal to the first axis;
   a component transfer assembly arranged to move a component transfer medium, referenced to a digital map position of the component on the source substrate, to a component release position corresponding to the X-Y-θ coordinate position of the source substrate for receiving the components from the end effectors, the component transfer assembly is arranged with respect to the turret assembly along the second axis on an opposing side of the turret assembly than the support assembly such that the end effector of the plurality of end effectors is positioned in the second axis facing the transfer medium for releasing the component from the end effector; and
   an image capture device aligned radially from the first axis and configured for capturing images of the components held by the end effectors during rotation of the turret,
   wherein any deviation of the component captured by the image capture device is corrected or compensated by way of the component transfer assembly prior to placement of the component on the component transfer medium.

2. The system of claim 1, wherein the X-Y-θ coordinates of each component included in the digital map position is referenced to a predefined datum of the source substrate.

3. The system of claim 1, further comprising a computer system configured for calculating misalignment of the held components based on the captured images.

4. The system of claim 3, wherein the misalignment is calculated relative to a digital map of the source substrate, the digital map identifying locations of the components relative to the source substrate.

5. The system of claim 4, wherein the digital map further identifies locations of defective components.

6. The system of claim 3, further comprising a component transfer actuation mechanism for actuating the component transfer assembly for correcting the misalignment.

7. The system of claim 1, further comprising:
a support actuation mechanism for actuating the support assembly for aligning the components of the source substrate to the end effectors, wherein the support assembly comprises a highly planar or ultra-planar wafer table for supporting the source substrate.

8. The system of claim 7, further comprising a first end effector and a second end effector such that in one instance of the turret rotation,
the first end effector is in position to place a first component on the component transfer medium; and
the second end effector is in position to pick a second component from the source substrate.

9. The system of claim 8, further comprising a third end effector such that in one instance of the turret rotation, the third end effector is holding a third component and is in position for capturing an image of the third component, wherein each end effector comprises a suction nozzle.

10. The system of claim 9 wherein:
the first axis is an horizontal axis;
the second axis is a vertical axis;
the support assembly is arranged in the second axis below the turret assembly such that the end effector of the plurality of end effectors is positioned in a vertical downward position facing the component in the X-Y-θ coordinate position of the source substrate for retrieving the component from the source substrate; and
the component transfer assembly is arranged in the second axis above the turret assembly such that the end effector of the plurality of end effectors is positioned in a vertical upward facing direction for releasing the component from the end effector.

11. A method for handling components, the method comprising:
moving a source substrate supported on a support assembly to a retrieval position, the support assembly positioned with respect to a turret assembly such that an end effector of a plurality of end effectors is positioned in a second axis facing a component in an X-Y-θ coordinate position of the source substrate for retrieving the component from the source substrate;
moving a component transfer medium on a component transfer assembly to a component release position corresponding to the X-Y-θ coordinate position of the source substrate, the component transfer assembly arranged along the second axis on an opposite side of the turret assembly of the support assembly, wherein the release position corresponds to a digital map position of the component on the source substrate, the component transfer medium for receiving the components from the plurality of end effectors of the turret assembly such that the end effector of the plurality of end effectors is positioned along the second axis facing the component transfer assembly for releasing the component from the end effector to the component transfer medium;
rotating a turret of the turret assembly about a first axis, the first axis is perpendicular to the second axis, the end effectors attached to and arranged peripherally around the turret and aligned radially from the first axis;
capturing images of the components held by the end effectors during rotation of the turret by an image capture device aligned radially from the first axis;
during rotation of the turret, actuating the end effectors to continually pick the components from the source substrate and place the picked components on the component transfer medium; and
correcting or compensating by way of the component transfer assembly, any deviation of the component X-Y-θ coordinate position captured by the image capture device prior to placement of the component on the component transfer medium.

12. The method of claim 11, wherein the X-Y-θ coordinates of each component included in the digital map position is referenced to a predefined datum of the source substrate.

13. The method of claim 11, further comprising calculating misalignment of the held components based on the captured images.

14. The method of claim 13, wherein the misalignment is calculated relative to a digital map of the source substrate, the digital map for identifying locations of the components relative to the source substrate and locations of defective components.

15. The method of claim 14, wherein correcting or compensating any deviation of the component X-Y-θ coordinate position comprises actuating the component transfer assembly for correcting the misalignment.

16. The method of claim 11, wherein moving a component transfer medium on a component transfer assembly to the component release position corresponding to the X-Y-θ coordinate position of the source substrate comprises actuating the support assembly for aligning the components of the source substrate to the end effectors.

17. The method of claim 16, further comprising rotating a first end effector and a second end effector along with the turret such that in one instance of said rotating:
the first end effector is in position to place a first component on the component transfer medium; and
the second end effector is in position to pick a second component from the source substrate.

18. The method of claim 17, further comprising rotating a third end effector along with the turret such that in one instance of said rotating, the third end effector is holding a third component and is in position for capturing one or more images of the third component, wherein each end effector comprises a suction nozzle.

19. The method of claim 11, wherein the source substrate is a semiconductor wafer, the components are semiconductor dies, and/or the component transfer medium is a die attach film.

20. The method of claim 18 wherein:
the first axis is an horizontal axis;
the second axis is a vertical axis;
the support assembly is arranged in the second axis below the turret assembly such that the end effector of the plurality of end effectors is positioned in a vertical downward position facing the component in the X-Y-θ coordinate position of the source substrate for retrieving the component from the source substrate; and
the component transfer assembly is arranged in the second axis above the turret assembly such that the end effector of the plurality of end effectors is positioned in a vertical upward facing direction for releasing the component from the end effector.

* * * * *